(12) United States Patent
Lee et al.

(10) Patent No.: US 7,826,263 B2
(45) Date of Patent: Nov. 2, 2010

(54) MEMORY SYSTEM INCLUDING FLASH MEMORY AND METHOD OF OPERATING THE SAME

(75) Inventors: Kyoong-Han Lee, Suwon-si (KR); Young-Joon Choi, Seongnam-si (KR); Yang-Sup Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 239 days.

(21) Appl. No.: 11/710,991

(22) Filed: Feb. 27, 2007

(65) Prior Publication Data

US 2008/0055989 A1    Mar. 6, 2008

(30) Foreign Application Priority Data

Sep. 6, 2006    (KR) .................... 10-2006-0085865

(51) Int. Cl.
G11C 16/06    (2006.01)
(52) U.S. Cl. ............................. 365/185.09; 365/185.02
(58) Field of Classification Search ............ 365/185.09, 365/185.02, 206; 714/5–7, 718, 763
See application file for complete search history.

(56) References Cited

U.S. PATENT DOCUMENTS

| | | | |
|---|---|---|---|
| 4,879,690 A * | 11/1989 | Anami et al. ............... 365/201 |
| 5,404,485 A | 4/1995 | Ban | |
| 5,905,854 A * | 5/1999 | Nielson et al. ................. 714/6 |
| 5,937,425 A | 8/1999 | Ban | |
| 6,715,104 B2 * | 3/2004 | Imbert de Tremiolles et al. 714/25 |
| 7,334,159 B1 * | 2/2008 | Callaghan ..................... 714/30 |
| 2003/0112667 A1 * | 6/2003 | Shimizu et al. ............. 365/200 |
| 2005/0204212 A1 * | 9/2005 | Noguchi et al. ............. 714/710 |
| 2006/0075320 A1 * | 4/2006 | Gendrier et al. ............ 714/763 |
| 2006/0085670 A1 * | 4/2006 | Carver et al. .................... 714/5 |
| 2007/0136640 A1 * | 6/2007 | Jarrar ........................ 714/763 |

FOREIGN PATENT DOCUMENTS

| | | |
|---|---|---|
| JP | 07-105698 | 4/1995 |
| JP | 11-345494 | 12/1999 |
| JP | 2002-150783 | 5/2002 |
| KR | 1020000062602 A | 10/2000 |
| KR | 1020040093411 A | 11/2004 |

* cited by examiner

*Primary Examiner*—Van Thu Nguyen
*Assistant Examiner*—Douglas King
(74) *Attorney, Agent, or Firm*—Volentine & Whitt, PLLC

(57) ABSTRACT

A method for operating a memory system including a flash memory device having a plurality of memory blocks includes determining whether a read error generated during a read operation of the flash memory device is caused by read disturbance and replacing a memory block which includes the read error, with a spare memory block if the read error is caused by read disturbance.

44 Claims, 9 Drawing Sheets

MEMORY SYSTEM INCLUDING FLASH MEMORY AND METHOD OF OPERATING THE SAME

BACKGROUND

1. Field of the Invention

The present disclosure generally relates to semiconductor memory devices and, more particularly, to a system which efficiently processes erroneous bits generated in a flash memory device.

A claim of priority under 35 U.S.C. §119 is made to Korean Patent Application No. 2006-85865, filed Sep. 6, 2006, the entire contents of which are hereby incorporated by reference.

2. Description of the Related Art

Many memory devices may inadvertently store defective data due to various reasons. In order to rectify this situation, various technologies for error detection and correction are used to recover or restore defective data. Data may be defective for various reasons. For example, data could be corrupted due to a variety of factors while being stored in a memory, or due to perturbations of data transmission channels between a source and destination.

Various approaches have been proposed to detect and correct defective data stored in memory devices. To this end, some of the well-known data error detecting and correcting techniques are the Reed-Solomon (RS) codes, Hamming codes, Bose-Chaudhury-Hocquenghem (BCH) codes, cyclic redundancy codes (CRC), and so forth. Moreover, in most applications employing nonvolatile memory devices, data is stored in these memory devices along with data known as error correction codes (ECC) (hereinafter, referred to as 'ECC data'). ECC data are provided to correct erroneous bits generated during a read operation in a flash memory device. However, the number of error bits that are correctable by ECC data is limited.

FIG. 1 is a block diagram of a general flash memory device, and FIG. 2 is a timing diagram showing a read operation in the flash memory device shown in FIG. 1. First, referring to FIG. 1, a general flash memory device includes a memory cell array that has pluralities of memory blocks. Specifically, FIG. 1 shows a single memory block, e.g., BLK0. The memory block BLK0 has strings (or NAND strings) 10, each being connected to columns or bit lines. Each string includes a string selection transistor SST, a ground selection transistor GST, and memory cells (or memory cell transistors). Furthermore, each string also includes memory cells MC0~MCn−1 serially connected between the selection transistors SST and GST. Gates of the selection transistors SST and GST are each coupled to string and ground selection lines SSL and GSL corresponding thereto, while control gates of the memory cell transistors MC0~MCn−1 are coupled to word lines WL0~WLn−1 corresponding thereto. In addition, bit lines BL0~BLm−1 are connected to page buffers PB corresponding thereto.

In the read operation, as illustrated in FIG. 2, a selected word line (e.g., WL0) is driven with a voltage of 0V, while deselected word lines (e.g., WL1~WLn−1) are driven with a read voltage Vread. During this operation, the string and ground selection lines SSL and GSL are driven with the read voltage Vread and the page buffers PB supply sensing currents to their corresponding bit lines BL0~BLm−1. Voltages of the bit lines BL0~BLm−1 may be determined by conditions of the memory cells coupled to the selected word line. For example, if the memory cell coupled to the selected word line is an on-cell, the bit line voltage corresponding thereto falls down to a ground voltage. In contrast, if the memory cell coupled to the selected word line is an off-cell, the bit line voltage corresponding thereto rises up to a power source voltage. Furthermore, the bit line voltages are detected by the page buffers PB as cell data.

For convenience of description, a memory cell coupled to a deselected word line is referred to as a deselected memory cell and a memory cell coupled to a selected word line is referred to as a selected memory cell. As stated above, in order to read data from the selected memory cell, the word lines of the deselected memory cell are supplied with the read voltage Vread. In particular, the read voltage Vread is set to a voltage level that is enough to turn on a memory cell transistor being conditioned in an off-state. During the read operation, the read voltage Vread is applied to the control gates of the deselected memory cell transistors, while the ground voltage is applied to a substrate (or bulk) of the deselected memory cell transistors. Furthermore, a predetermined voltage is applied to drains of the deselected memory cell transistors. This bias condition is similar to that for programming a cell. Because of that, as shown in FIG. 3, electrons may be injected into a floating gate of the deselected memory cell transistor from the substrate during the read operation. That is, the deselected memory cell transistors in on-states (or erased states) are softly programmed under the bias condition of the read operation, which is referred to as 'read disturbance' in general. This 'read disturbance' may be problematic.

For example, the read disturbance may gradually increase threshold voltages of memory cells conditioned in on-states (or erased states). As shown by dashed lines of FIG. 4, threshold voltages of the on-state memory cells may increase with the repetition of the read operation. This phenomenon may make an on-state memory cell be erroneously detected as an off-cell. This erroneous state detection of the cell because of an increase in the threshold voltage due to the read disturbance may cause a read failure.

As mentioned above, bit errors generated from the read operation can be repaired by techniques such as error detection and correction without any other remedial procedure such as a process of block replacement. Referring to FIG. 5, the probability of read failure may gradually increase with a repetition of the read operation. That is, data corrected by an error detection/correction operation is highly probable to have another error during the next read operation. When the number of error bits in read data is larger than the permitted number of error bits, a reserved memory block, which is additionally provided to a flash memory device, may be substituted for a memory block including defective data by using a remedial process such as block replacement.

Thus, as described above, once the read data includes error bits under the permitted error bit number, the error bits are repaired by means of a given process of error detection and correction. However, even when the read data has been for errors, it is very probable that the error-corrected data may have another error after the read operation. Therefore, there is a need for a technique to improve the reliability of error-corrected data.

SUMMARY OF THE INVENTION

One aspect of the present disclosure includes a method for operating a memory system including a flash memory device having a plurality of memory blocks, the method comprising determining whether a read error generated during a read operation of the flash memory device is caused by read disturbance and replacing a memory block which includes the read error, with a spare memory block if the read error is caused by read disturbance.

Another aspect of the present disclosure includes a method for operating a memory system including a flash memory device having a plurality of memory blocks, the method comprising copying read error information from the flash memory device into a buffer RAM at a power-up time, determining whether there is a memory block having a correctable read error based on the read error information of the buffer RAM, and replacing a memory block including the correctable read error with a spare memory block.

Another aspect of the present disclosure includes a memory system comprising a flash memory device including a plurality of memory blocks, a memory controller which operates the flash memory device, wherein the memory controller is configured to determine whether a read error generated during a read operation of the flash memory device is caused by a read disturbance, and replace a memory block which includes the read error with a spare memory block if the read error is caused by the read disturbance.

Yet another aspect of the present disclosure includes a memory system comprising a flash memory device including a plurality of memory blocks, a memory controller which operates the flash memory device, wherein the memory controller comprises a central processing unit, a buffer RAM which stores data read from the flash memory device under control of the central processing unit, and an error check and correction circuit which detects whether there is a read error in data transferred to the buffer RAM, wherein if there is a read error in the data transferred to the buffer RAM, the central processing unit determines whether the read error is caused by read disturbance based on a detection result of the error check and correction circuit, wherein if the read error is detected as being caused by the read disturbance, the central processing unit stores read error information of a memory block including the read error into the buffer RAM.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
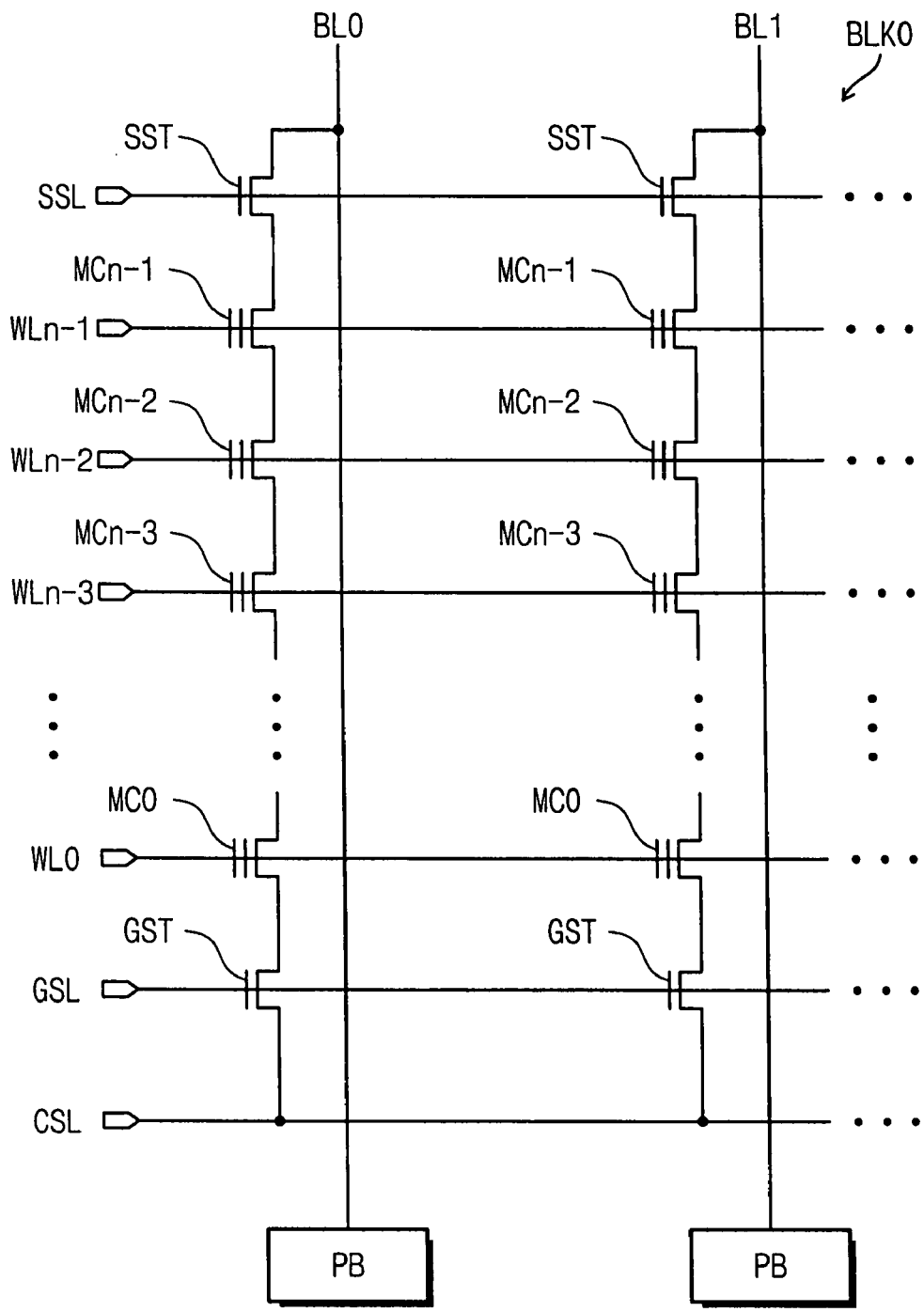
FIG. 1 is a block diagram of a general flash memory device.
Figure 2:
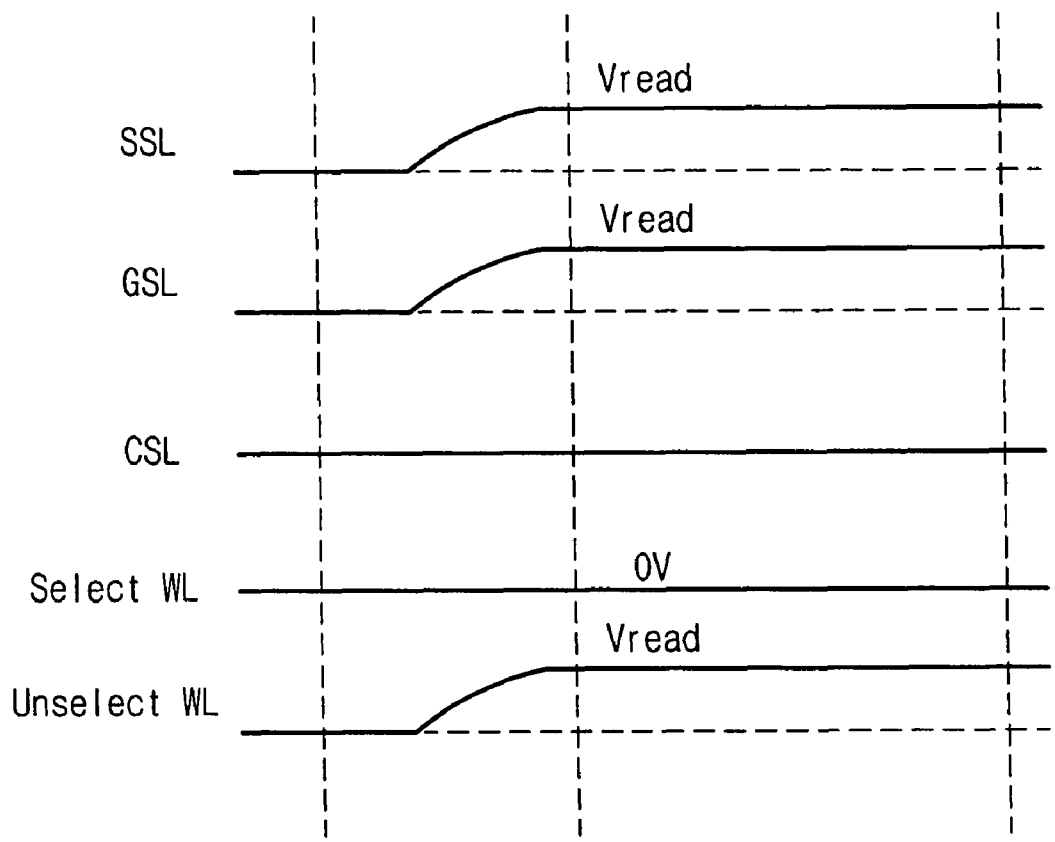
FIG. 2 is a timing diagram showing a read operation in the flash memory device shown in FIG. 1.
Figure 3:
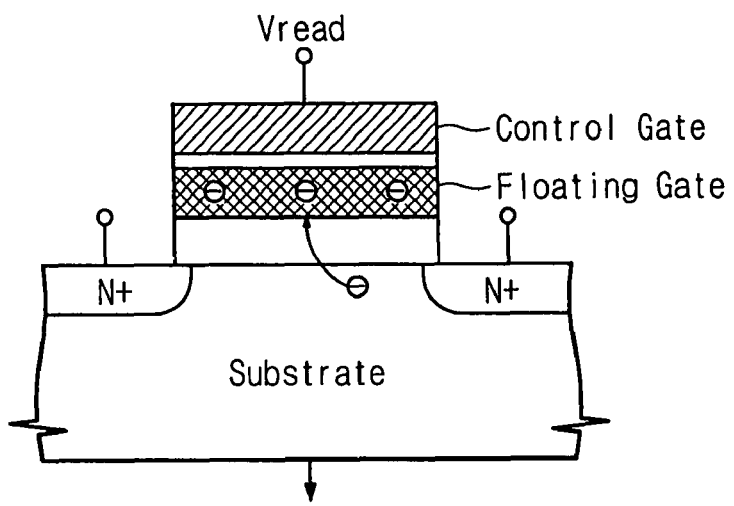
FIG. 3 is a sectional schematic showing a soft programming effect due to read disturbance.
Figure 4:
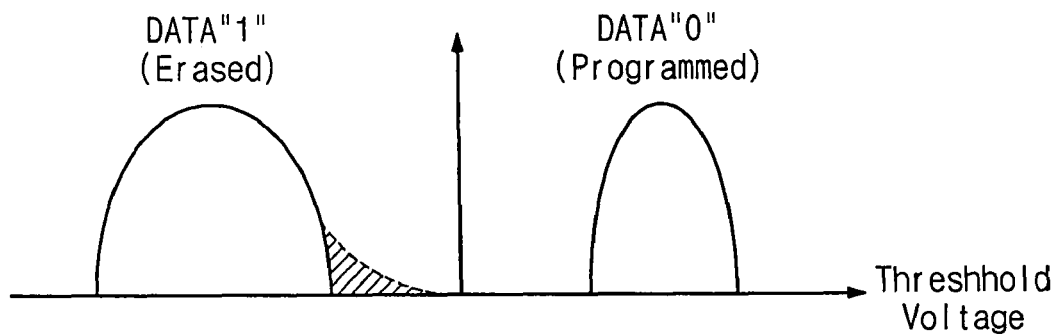
FIG. 4 is a diagram illustrating distribution profiles of threshold voltages corresponding to on and off-cells.
Figure 5:
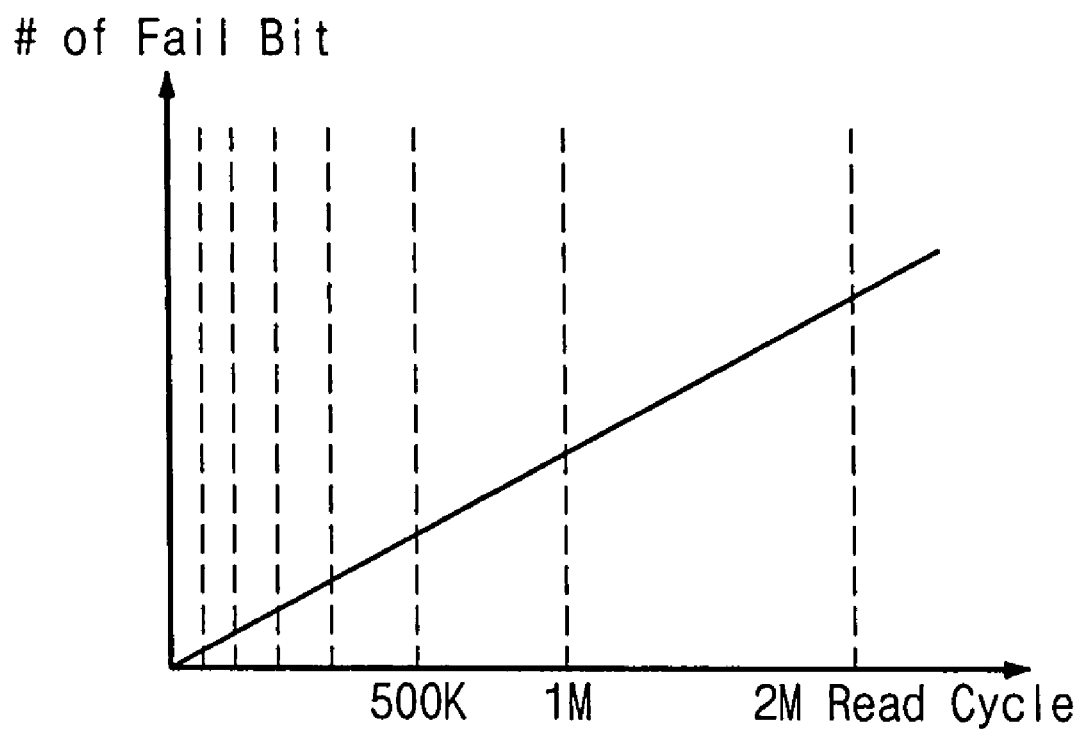
FIG. 5 is a graph showing correlations between read cycles and read fails.

Exemplary embodiments of the present invention will be described below in more detail with reference to the accompanying drawings, using a flash memory device as an example for illustrating structural and operational features by the invention. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 6:
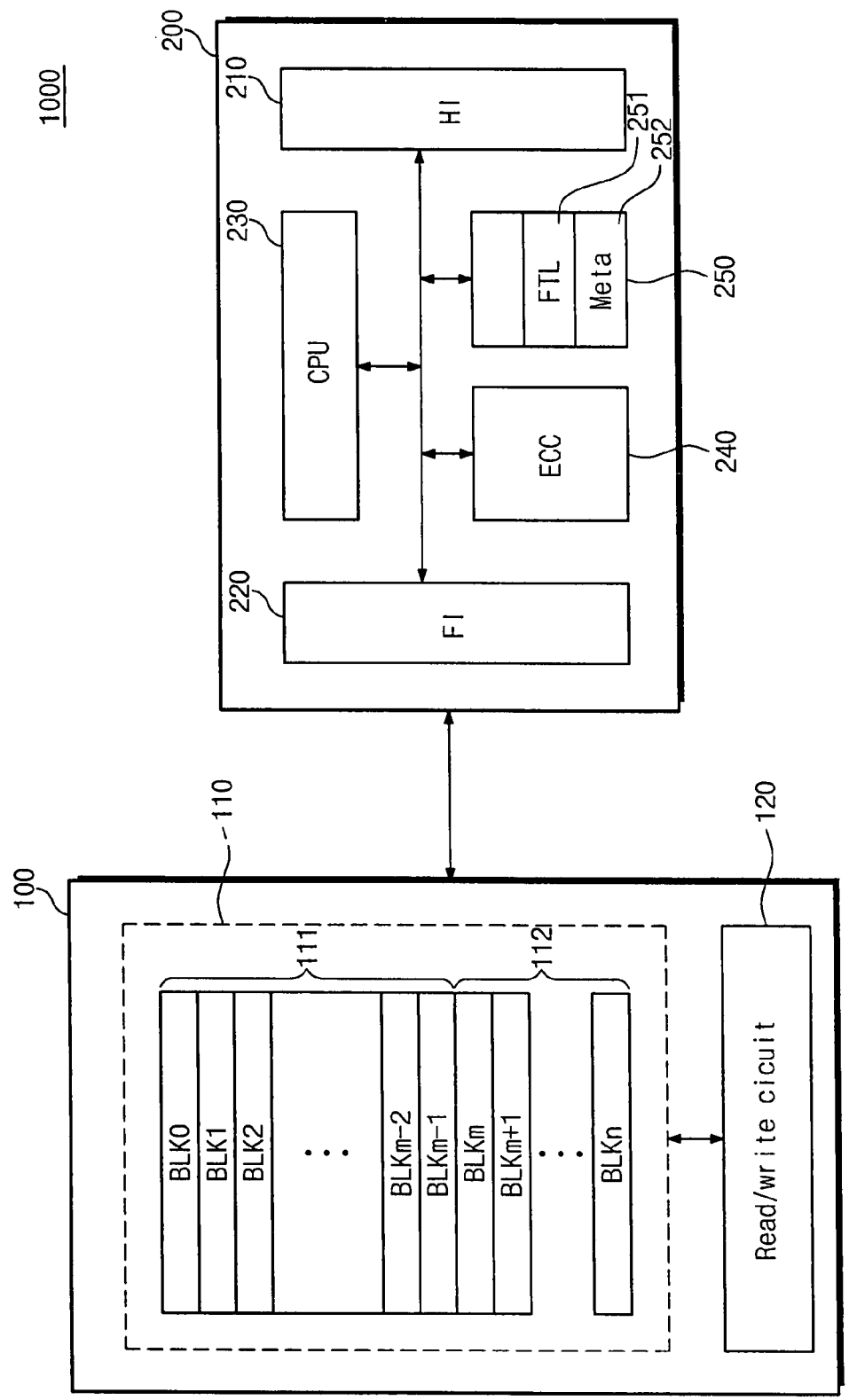
FIG. 6 is a block diagram illustrating a memory system in accordance with an exemplary disclosed embodiment.

FIG. 6 is a block diagram illustrating a memory system 1000 according to an exemplary disclosed embodiment. Referring to FIG. 6, the memory system 1000 is comprised of a flash memory device 100 and a memory controller 200. The flash memory device 100 may include a NAND flash memory device that is well known in this art. The flash memory device 100 includes a memory cell array 110 and a read/write circuit 120. The memory cell array 110 is divided into first and second fields 111 and 112 which store N-bit data information (N is a positive integer). Each of the first and second fields 111 and 112 may be composed of plural memory blocks. For example, the memory blocks of the first field 111 are used to store user data and/or code data, while the memory blocks of the second field 112 are used to store meta-data for managing the memory blocks. Furthermore, the first field 111 may include spare memory blocks for block replacement. In addition, each memory block of the first and second fields 111 and 112 may be composed of main and spare regions. The main region stores normal data, while the spare region may store information (e.g., ECC data) relevant to data of the main region. However, in an exemplary disclosed embodiment, the spare region may store other data in addition to ECC data.

In an exemplary disclosed embodiment, the meta-data stored in the second field 112, as described later, may contain table information that has read error information for the memory blocks of the first field 111. This read error information denotes whether a permissible error has been generated during a read operation for a memory block of the first field 111. The read error information is used to substitute a spare memory block for a memory block including the permissible error, which will be detailed later. This block replacement may make it possible to solve the error due to the read disturbance. In other words, the block replacement may be able to repair a read failure that causes an on-cell (or erased cell) to be detected as an off-cell due to the read disturbance. Thus, the block replacement may refresh a memory block where a permissible bit error occurs.

The read/write circuit 120 may be formed to read and write data from and into the memory cell array 110. Although not shown in the figures, the read/write circuit 120 may be comprised of a row decoder, a column decoder, a page buffer circuit, and a high voltage generator. The components of the read/write circuit 120 are well known in this art, so these will not be described further. In an exemplary embodiment, a writing operation may include programming and erasing operations.

Referring to FIG. 6, the memory controller 200 is configured to control operations of the flash memory device 100 in response to requests from a host (e.g., a computing system). The memory controller 200 includes a host interface 210, a flash interface 220, a central processing unit (CPU) 230 as a processing unit, an error check and correction (ECC) circuit 240, and a buffer RAM 250. The host interface 210 is configured to interface the memory controller 200 with the host and the flash interface 220 is configured to interface the memory controller 200 with the flash memory device 100. The CPU 230 is organized to control reading/writing operations of the flash memory device 100 in response to requests from the host. The ECC circuit 240 may be configured to generate ECC data from data (i.e., main data) transferred from the flash memory device 100. The ECC data generated thereby are transferred to the flash memory device 100 so as to be stored in the spare region of a page containing main data. In addition, the ECC circuit 240 may be configured to detect errors on data read out from the flash memory device 100. For example, if a correctable read error is detected from read data, the ECC circuit 240 operates to repair the error of the read data from the flash memory device 100. Furthermore, the buffer RAM 250 may be used to temporarily store data read out from the flash memory device 100 or provided from the host. In addition, the buffer RAM 250 stores a flash translation layer (FTL) 251. The FTL 251 may be operated by the CPU 230.

Functions of the FTL include management of mapping information about logical and physical addresses, management of bad blocks, management of data preservability against inadvertent power interruption, and management of durability. Exemplary FTL functions are disclosed in U.S. Pat. No. 5,404,485 entitled "FLASH FILE SYSTEM", U.S. Pat. No. 5,937,425 entitled "FLASH FILE SYSTEM OPTIMIZED FOR PAGE-MODE FLASH TECHNOLOGIES", and U.S. Pat. No. 6,381,176 entitled "METHOD OF DRIVING REMAPPING IN FLASH MEMORY AND FLASH MEMORY ARCHITECTURE SUITABLE THEREFOR", all of which are incorporated by reference.

In an exemplary disclosed embodiment, the buffer RAM 250 may be used to store table information 252 necessary for managing read error information. The table information 252 is meta-data stored in the second field 112 of the flash memory device 100. In an exemplary embodiment, the table information 252 may be copied into the buffer RAM 250 from the second field 112 under control of the CPU 230 at a time of power-up. Thus, for example, if read data includes error bits such that the number of error bits are correctable by the ECC circuit 230, the CPU 230 updates the table information 252 so as to inform the system 1000 that there is a read error on a memory block including a page involved in the read operation. It may be beneficial if the updated table information will also be stored in the second field 112 of the flash memory device 100 under control of the CPU 230 along with every update of the table information 252. If the table information 252 is updated, i.e., if a correctable read error is generated, a memory block including the read error will be replaced with a spare memory block belonging to the first field 111 of the memory cell array 110 under control of the CPU 230. This process of block replacement may be carried out automatically under control of the CPU 230 at the power-up time or during the update of the table information, which will be detailed later. In this case, the memory block having the read error may be allocated to a spare memory block after being erased.

Figure 7:
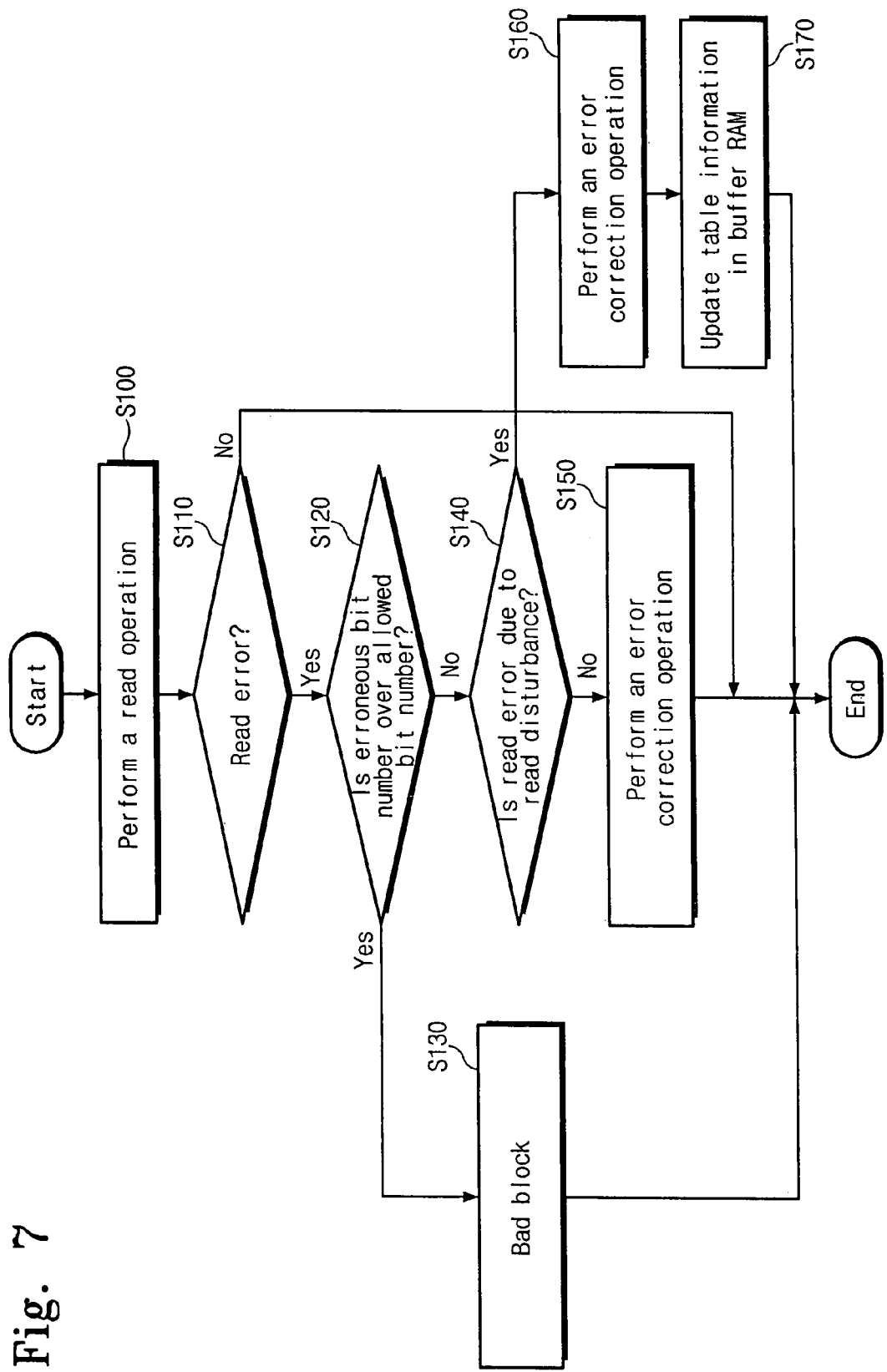
FIG. 7 is a flow chart showing an operational procedure to manage read errors in an exemplary disclosed embodiment of a memory system.

FIG. 7 is a flow chart showing an operational procedure to manage read errors in the memory system according to an exemplary disclosed embodiment. When there is a request from a host for a read operation, the memory controller 200 operates to control the flash memory device 100 for the read operation (S100). As is well known in the art, the memory controller 200 transfers a read command and address to the flash memory device 100 in accordance with a predetermined timing. In addition, the read/write circuit 120 of the flash memory device 100 reads data from a page of a memory block corresponding to the address input in response to the read command. The data read thereby may be transferred to the buffer RAM 250 through the flash interface 220 under control of the CPU 230.

While transferring data to the buffer RAM 250, the system determines whether a read error has been generated from the read data (S110). To this end, a transmission path for read data may be implemented in various ways. For example, read data may be transferred to the ECC circuit 240 and the buffer RAM 250 at the same time. In this case, the ECC circuit 240 is able to detect a read error by means of ECC data after completing the data transmission to the buffer RAM 250. On the other hand, the read data can be transferred to the buffer RAM 250 by way of the ECC circuit 240. In this case, the ECC circuit 240 is able to detect a read error by means of ECC data before completing the data transmission to the buffer RAM 250. Alternatively, the read data is stored in the buffer RAM 250 and then the ECC circuit 240 detects a read error by reading the read data stored in the buffer RAM 250. Beneficially, the read data is transferred into the ECC circuit 240 and then the buffer RAM 250.

The ECC circuit 240 uses ECC data to find whether there is an error in the read data, and then stores results of the determination, i.e., the number of error bits and error-positional information (e.g., address information), which represents the number and positions of error bits, into an internal register. After completing the ECC operation, the CPU 230 determines, according to information stored in the ECC circuit 240, whether there is a read error. If it determines there is no read error on the read data, the read data stored in the buffer RAM 250 is transferred into a host through the host interface 210 and thereafter the read operation is terminated.

On the other hand, if the circuit 240 determines there is a read error from the read data, the CPU 230 determines, according to the information included in the error bit number stored in the ECC circuit 240, whether the current number of error bits is over the allowed number of error bits (S120). If the number of error bits on the read data is found as being over the allowed number of error bits, the CPU 230 puts the memory block, which includes the read error, into a bad block by means of FTL (S130). On the other hand, if the current number of error bits on the erroneous read data is not over than the allowed number of error bits, the CPU 230 then determines whether the read error is caused by read disturbance (S140).

In an exemplary embodiment, whether a read error is caused by read disturbance or not may be determined by reading erroneous data from the buffer RAM 250 by means of positional information stored in the ECC circuit and detecting whether the read data is a logic '0'. This is because a read error due to read disturbance generally means that data of logical '1' (corresponding to an erased state of a memory cell) changes to data of logical '0' (corresponding to a programmed state of a memory cell). In other words, a read error due to read disturbance means that an erased cell is detected as a programmed cell.

If a read error is detected as not being caused by read disturbance, the CPU 230 corrects the error of data stored in the buffer RAM 250 (S150). For example, the CPU 230 reads data from the buffer RAM 250 with reference to the information (i.e., error-positional information) stored in the ECC circuit 240, corrects the read data, and then stores error-corrected data in the buffer RAM 250. In an alternative exemplary embodiment, correcting an error in data may be carried out by the ECC circuit 240 under control of the CPU 230. For example, erroneous data may be read from the buffer RAM 250 under control of CPU 230, and such erroneous data read out may be transferred to the ECC circuit 240. The ECC circuit 240 then corrects the erroneous data and error-corrected data is stored back in the buffer RAM 250 under control of the CPU 230. Next, data stored in the buffer RAM 250 is transferred to the host and the read operation is terminated.

If a read error is detected as being caused by read disturbance, as mentioned above, an error in the data stored in the buffer RAM 250 is corrected by the CPU 230 or the ECC circuit 240 (S160). Furthermore, the table information 252 stored in the buffer RAM 250 is updated by the CPU 230 so as to represent the generation of a correctable read error in the appropriate memory block (S1170). In an exemplary embodiment, the updated table information 252 is stored in the second field 112 of the memory cell array 110 under control by the CPU 230. The read operation is terminated after transferring data from the buffer RAM 250 to the host through the host interface 210. In an exemplary embodiment, the time taken to store the updated table information 252 in the second field 112 of the memory cell array 110 may be variable. For example, after transferring data from the buffer RAM 250 to the host through the host interface 210, the time taken to store updated table information 252 in the second field 112 of the memory cell array 110 may depend on the operating speed of the memory controller 200. Thus, the time taken to store the updated table information 252 in the memory cell array 110 may depend on the type of memory controller 200 used in the system 1000. One skilled in the art will appreciate that the time for storing the updated table information 252 in the second field 112 of the memory cell array 110 may depend on other factors too such as, for example, the distance between the memory controller 200 and the flash memory device 100.

Furthermore, in exemplary disclosed embodiments, the steps S110, S120, S140, S150, and S160 may be carried out through the ECC circuit 240 instead of the CPU 230. For example, the ECC circuit 240 determines whether the number of error bits in data having a read error is over the allowed number of error bits. If the number of error bits in data having a read error is detected as being over the allowed number of error bits, the ECC circuit 240 informs the CPU 230 that there is an incorrectable read error. Then, the CPU 230 uses the FTL 251 to put the memory block (which has a read error), into a bad block. If the number of error bits on data having a read error is detected as not being over the allowed number of error bits, the ECC circuit 240 determines whether the read error is caused by read disturbance. If the read error is not because of read disturbance, the ECC circuit 240 corrects the data error stored in the buffer RAM 250. To this end, correction of the data error may be carried out by the ECC circuit 240 under control of the CPU 230. For example, erroneous data may be read out from the buffer RAM 250 under control of the CPU 230, and the erroneous data read out may be transferred to the ECC circuit 240. The ECC circuit 240 may then correct the erroneous data and the error-corrected data is stored in the buffer RAM 250 under control of the CPU 230. Then, the data stored in the buffer RAM 250 may be transferred to the host by way of the host interface 210, thus terminating the read operation. On the other hand, if a read error is detected as being caused by read disturbance, the ECC circuit 240 corrects the read error of data stored in the buffer RAM 250 as stated above.

Figure 8:
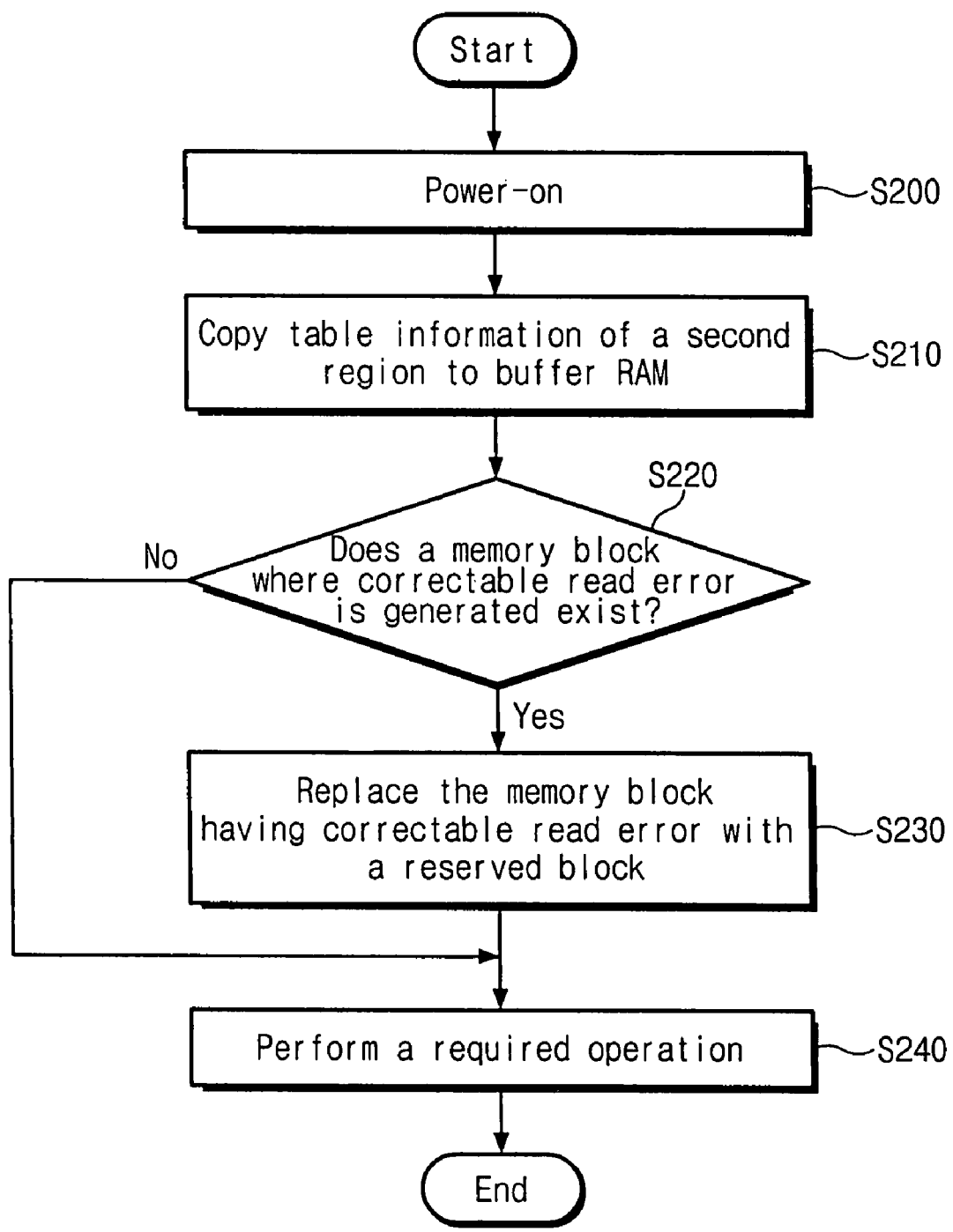
FIG. 8 is a flow chart showing an operational procedure for block replacement (or refresh) in the memory system of an exemplary disclosed embodiment.

FIG. 8 is a flow chart showing an operational procedure for block replacement (or refresh) in the memory system of an exemplary disclosed embodiment. When a power supply voltage is supplied to the memory system 1000 (S200), the table information stored in the second field 112 of the flash memory device 100 is copied into the buffer RAM 250 of the memory controller 200 (S210). Next, the CPU 230 determines whether there is a memory block having a correctable read error. If there is a memory block that includes a correctable read error, data of the memory block including the correctable read error is copied into a spare memory block. Namely, a memory block having a correctable read error is replaced by a spare memory block (S230). Specifically, erroneous data among data of the memory block having a correctable read error is repaired by the ECC circuit 240, and the error-corrected data is copied into the spare memory block. In detail, data stored in each page of a memory block having a correctable read error is read out through the read/write circuit 120, and temporarily stored in the buffer RAM 250 in the same manner as aforementioned. During this process, when an error is detected in read data, the erroneous data may be corrected by the same procedure as aforementioned. Data stored in the buffer RAM 250 is stored in corresponding pages of a spare memory block through the read/write circuit 120. Once data of the memory block having a correctable read error is copied into the spare memory block, an operation requested by the host is carried out (S240). If it is determined that a correctable read error is absent in a memory block, the procedure goes to the step S240.

Figure 9:
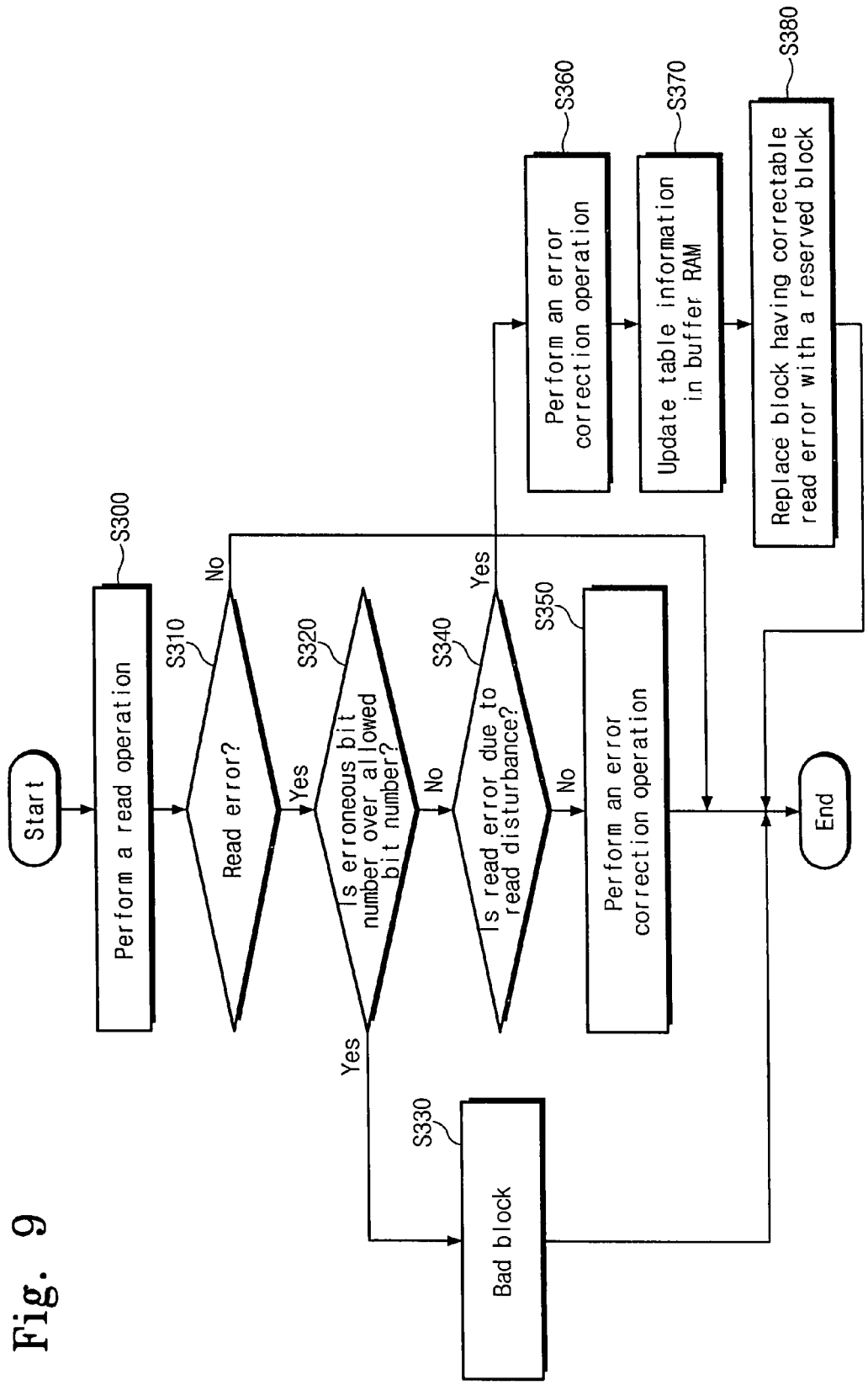
FIG. 9 is a flow chart showing an operational procedure to manage read errors in the memory system according to an alternative exemplary disclosed embodiment.

FIG. 9 is a flow chart showing an operational procedure to manage read errors in the memory system according to an alternative exemplary disclosed embodiment. The procedure shown in FIG. 9 is substantially similar to that of FIG. 7, except that the block replacement is carried out before a power-off time. In FIG. 9, S300~S370 are similar to the steps S100~S170 of FIG. 7 in substance, so these processes will not be discussed again. As shown in FIG. 9, at step S380, an operation for block replacement is carried out for a memory block having a correctable read error. Namely, a memory block having a correctable read error is refreshed. This block replacement is substantially similar to that described with respect to FIG. 8, so it will not be discussed again.

Flash memory devices are nonvolatile memories capable of storing data even in the event of a power loss. With a rapid increase in the use of mobile apparatuses such as cellular phones, personal digital assistants (PDA), digital cameras, portable gaming consoles, and MP3, flash memory devices are widely employed as code storage and data storage devices. Furthermore, flash memory devices may also be utilized in home applications such as high-definition TVs, digital versatile disks (DVDs), routers, and global positioning systems (GPSs).

Figure 10:
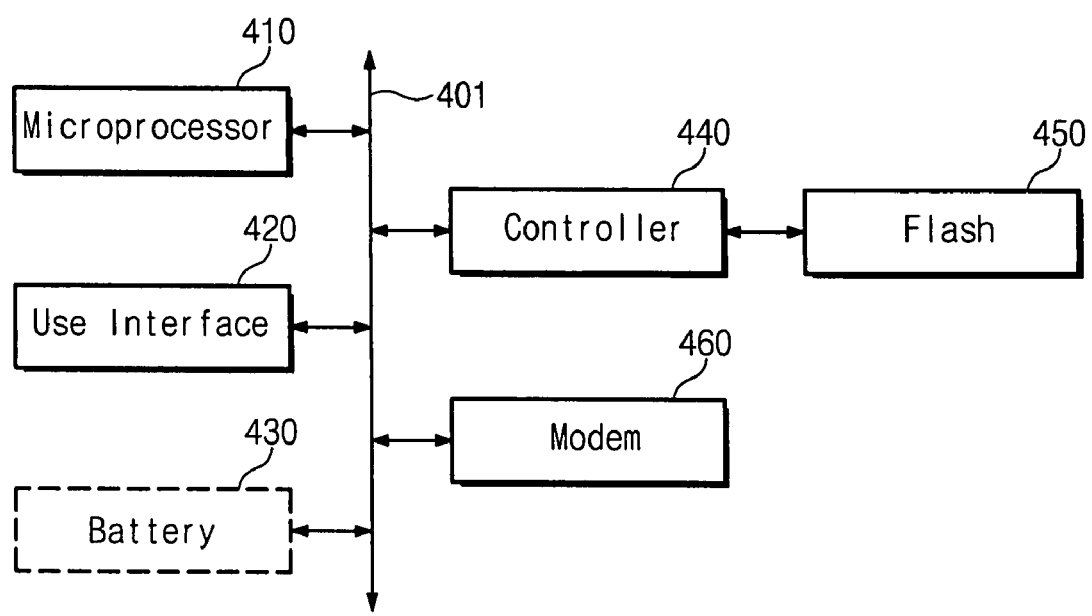
FIG. 10 is a schematic block diagram of a computing system including a memory controller and a flash memory device according to an exemplary disclosed embodiment.

FIG. 10 shows a schematic computing system including the exemplary disclosed flash memory device and memory controller. The exemplary disclosed computing system includes a microprocessor 410 electrically connected to a bus 401, a use interface 420, a modem 460 such as a baseband chipset, a memory controller 440, and the flash memory device 450. To this end, the memory controller 440 and the flash memory device 450 may be configured as discussed above. In the flash memory device 450, N-bit data (N is a positive integer) to be processed by the microprocessor 410 are stored through the memory controller 440. If the computing system shown in FIG. 11 is a mobile apparatus, it may further include a battery 430 which supplies power to the system. Furthermore, although not shown in FIG. 11, the computing system may further include other components such as an application chipset, a camera image processor (e.g., CMOS image sensor; CIS), a mobile DRAM, etc.

The above-described memory system may be used in any electronic device. The system may be able to reduce the probability of generating a correctable read error by refreshing a memory block having a read error due to read disturbance. Therefore, the disclosed system may improve the reliability of a flash memory device and a memory system including the flash memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed:

1. A method of operating a memory system, the memory system including a flash memory device having a plurality of memory blocks, said method comprising:
   determining whether a read error generated during a read operation of the flash memory device is caused by a read disturbance; and
   replacing a memory block which includes the read error with a spare memory block if the read error is caused by the read disturbance,
   wherein the read disturbance is caused by programming of a memory cell of a deselected word line during reading of a memory cell of a selected word line.

2. The method as set forth in claim 1, wherein the number of error bits in data having the read error is equal to or smaller than an allowed number of error bits.

3. The method as set forth in claim 1, further comprising, when the read error is detected as being unrelated to the read disturbance, correcting an error of data read from the flash memory device and outputting the error-corrected data to an external system.

4. The method as set forth in claim 1, wherein the replacing of the memory block comprises:
   correcting an error in the read data and outputting the error-corrected data to an external system;
   updating read error information of the memory block having the read error; and
   replacing the memory block which includes the read error with the spare memory block when the read error is caused by the read disturbance in accordance with the updated read error information.

5. The method as set forth in claim 4, wherein the updated read error information is stored in the flash memory device.

6. The method as set forth in claim 5, wherein the replacing with the spare memory block is carried out in accordance with the read error information read from the flash memory device at a power-up time.

7. The method as set forth in claim 4, wherein the memory blocks are divided into first and second field memory blocks, the memory blocks of the first field being used to store user data and the memory blocks of the second field being used to store the read error information.

8. The method as set forth in claim 4, wherein the memory block replaced with the spare memory block is designated as an empty memory block after erasure.

9. The method as set forth in claim 1, wherein determining whether the read error is caused by the read disturbance includes determining whether a data bit of the read data has changed from a '1' logic state to a '0' logic state.

10. The method as set forth in claim 1, wherein data of the memory block which includes the read error is repaired, then the repaired data of the memory block is copied into the spare memory block.

11. A method of operating a memory system, the memory system including a flash memory device having a plurality of memory blocks, said method comprising:
    copying read error information from the flash memory device into a buffer RAM at a power-up time;
    determining whether there is a memory block having a correctable read error based on the read error information of the buffer RAM; and
    replacing a memory block including the correctable read error with a spare memory block if the read error is caused by a read disturbance,
    wherein the read disturbance is caused by programming of a memory cell of a deselected word line during reading of a memory cell of a selected word line.

12. The method as set forth in claim 11, wherein the read error information represents whether the read error of the memory block is caused by the read disturbance.

13. The method as set forth in claim 12, wherein the memory blocks are divided into first and second field memory blocks, the memory blocks of the first field being used to store user data and the memory blocks of the second field being used to store the read error information.

14. The method as set forth in claim 12, wherein the memory block replaced with the spare memory block is designated as an empty memory block after erasure.

15. The method as set forth in claim 12, wherein determining whether the read error is caused by the read disturbance includes determining whether a data bit of the read data has changed from a '1' logic state to a '0' logic state.

16. The method as set forth in claim 12, further comprising executing an operation requested by an external system when there is no memory block having a correctable read error.

17. The method as set forth in claim 11, further comprising:
    determining whether a read error arising from a read operation of the flash memory device is caused by the read disturbance;
    correcting, if the read error is detected as being unrelated to the read disturbance, an error in data read from the flash memory device and outputting the error-corrected data to an external system;
    updating the buffer RAM with the read error information of the memory block having the read error; and
    storing the read error information of the updated buffer RAM in the flash memory device.

18. The method as set forth in claim 11, wherein data of the memory block which includes the read error is repaired, then the repaired data of the memory block is copied into the spare memory block.

19. A memory system comprising:
    a flash memory device including a plurality of memory blocks; and
    a memory controller which operates the flash memory device, wherein the memory controller is configured to determine whether a read error generated during a read operation of the flash memory device is caused by a read disturbance, and replace a memory block which includes the read error with a spare memory block if the read error is caused by the read disturbance,
    wherein the read disturbance is caused by programming of a memory cell of a deselected word line during reading of a memory cell of a selected word line.

20. The memory system as set forth in claim 19, wherein a number of error bits in data having the read error is equal to or smaller than a number of error bits allowed by the memory controller.

21. The memory system as set forth in claim 19, wherein when the read error is unrelated to the read disturbance, the memory controller operates to correct an error in data read from the flash memory device and output the error-corrected data to an external system.

22. The memory system as set forth in claim 19, wherein the memory controller comprises a buffer RAM configured to temporarily store data read from the flash memory device or data to be transferred to the flash memory device.

23. The memory system as set forth in claim 22, wherein the memory controller operates to make the buffer RAM store read error information of the memory block having the read error.

24. The memory system as set forth in claim 23, wherein the read error information stored in the buffer RAM is stored in the flash memory device under control of the memory controller.

25. The memory system as set forth in claim 24, wherein the memory controller operates to make the buffer RAM store the read error information output from the flash memory device at a power-up time.

26. The memory system as set forth in claim 25, wherein the memory controller operates to determine, with reference to the read error information stored in the buffer RAM, whether there is a memory block having a correctable read error.

27. The memory system as set forth in claim 26, wherein the memory controller is configured to control the flash memory device to replace a memory block having the correctable read error with a spare block.

28. The memory system as set forth in claim 27, wherein replacing with the spare memory block is carried out in accordance with the read error information read from the flash memory device at the power-up time.

29. The memory system as set forth in claim 28, wherein the memory blocks are divided into first and second field memory blocks, the memory blocks of the first field being configured to store user data and the memory blocks of the second field being configured to store the read error information.

30. The memory system as set forth in claim 23, wherein the read error information represents whether the read error of the memory block is caused by the read disturbance.

31. The memory system as set forth in claim 23, wherein the memory controller determines whether the read error is caused by the read disturbance based on whether a data bit has changed from a '1' logic state to a '0' logic state.

32. The memory system as set forth in claim 19, wherein the flash memory device stores one of single-bit data and multi-bit data.

33. The memory system as set forth in claim 19, wherein the memory block replaced with the spare memory block is designated as an empty memory block after erasure under control of the memory controller.

34. The memory system as set forth in claim 19, wherein data of the memory block which includes the read error is repaired, then the repaired data of the memory block is copied into the spare memory block.

35. A memory system comprising:
a flash memory device including a plurality of memory blocks; and
a memory controller which operates the flash memory device, wherein the memory controller comprises a central processing unit, a buffer RAM which stores data read from the flash memory device under control of the central processing unit, and an error check and correction circuit which detects whether there is a read error in data transferred to the buffer RAM,
wherein if there is a read error in the data transferred to the buffer RAM, the central processing unit determines whether the read error is caused by read disturbance based on a detection result of the error check and correction circuit, wherein, when the read error is detected as being caused by the read disturbance, the central processing unit stores read error information of a memory block including the read error into the buffer RAM,
wherein the central processing unit is configured to control the flash memory device to replace the memory block including the read error with a spare memory block, based on the read error information of the buffer RAM, and
wherein the read disturbance is caused by programming of a memory cell of a deselected word line during reading of a memory cell of a selected word line.

36. The memory system as set forth in claim 35, wherein the memory blocks are divided into first and second field memory blocks, the memory blocks of the first field being configured to store user data and the memory blocks of the second field being configured to store the read error information.

37. The memory system as set forth in claim 36, wherein replacing with the spare memory block is carried out in accordance with the read error information read from the flash memory device at the power-up time.

38. The memory system as set forth in claim 37, wherein the central processing unit operates to determine, with reference to the read error information stored in the buffer RAM, whether there is a memory block having a correctable read error.

39. The memory system as set forth in claim 38, wherein the central processing unit is configured to control the flash memory device to replace a memory block having the correctable read error with a spare block.

40. The memory system as set forth in claim 35, wherein a number of error bits in data having the read error is equal to or smaller than a number of error bits allowed by the error check and correction circuit.

41. The memory system as set forth in claim 35, wherein the central processing unit is configured to detect whether a data bit having an error has changed logically to '0' from '1' in accordance with the detection result of the error check and correction circuit.

42. The memory system as set forth in claim 41, wherein whether the read error is caused by the read disturbance is determined by whether a data bit has changed logically from '1' to '0'.

43. The memory system as set forth in claim 35, wherein the memory block replaced with the spare memory block is designated as an empty memory block after erasure.

44. The memory system as set forth in claim 35, wherein data of the memory block which includes the read error is repaired, then the repaired data of the memory block is copied into the spare memory block.

* * * * *